US008315680B2

(12) United States Patent
Le Feuvre et al.

(10) Patent No.: US 8,315,680 B2

(45) Date of Patent: Nov. 20, 2012

(54) SUPERCONDUCTING JOINTS

(75) Inventors: Mark James Le Feuvre, Oxford (GB); Michael Simpkins, Buckinghamshire (GB)

(73) Assignee: Siemens PLC, Frimley, Camberley, Surrey (GB)

( * ) Notice: Subject to any disclaimer, the term of this patent is extended or adjusted under 35 U.S.C. 154(b) by 0 days.

(21) Appl. No.: 13/357,974

(22) Filed: Jan. 25, 2012

(65) Prior Publication Data

US 2012/0190553 A1 Jul. 26, 2012

(30) Foreign Application Priority Data

Jan. 25, 2011 (GB) .................................. 1101220.0

(51) Int. Cl.
*H01L 39/24* (2006.01)

(52) U.S. Cl. ....................................... 505/230; 505/190

(58) Field of Classification Search .................. 505/163, 505/190, 230, 211
See application file for complete search history.

(56) References Cited

U.S. PATENT DOCUMENTS

| | | | | |
|---|---|---|---|---|
| 3,422,529 | A * | 1/1969 | Nuding | 29/599 |
| 4,631,808 | A | 12/1986 | Jones | |
| 5,111,574 | A * | 5/1992 | Smathers | 29/599 |
| 5,583,319 | A * | 12/1996 | Lieurance | 174/84 R |
| 7,152,302 | B2 | 12/2006 | Morita | |
| 2009/0101325 | A1 * | 4/2009 | Belton et al. | 165/185 |
| 2009/0105079 | A1 | 4/2009 | Leghissa | |

FOREIGN PATENT DOCUMENTS

| | | | |
|---|---|---|---|
| EP | 1 276 171 | A2 | 1/2003 |
| JP | 3866926 | B2 | 9/2002 |
| JP | 2002260463 | A | 9/2002 |
| JP | 200322719 | A | 1/2003 |
| KR | 2003 0054150 | A | 7/2003 |

OTHER PUBLICATIONS

Patent Abstracts of Japan JP2009-099988, date of publication of application May 7, 2009.

* cited by examiner

*Primary Examiner* — Colleen Dunn

(74) *Attorney, Agent, or Firm* — Schiff Hardin LLP

(57) ABSTRACT

In a cold superconducting joint, a joint cup is provided. Lengths of superconducting filaments are placed in the joint cup. A superconducting material fills the joint cup in contact with the superconducting filaments and in thermal and mechanical contact with a pipe carrying a cryogen. The pipe extends into the joint cup and the superconducting material extends around the pipe within the joint cup.

23 Claims, 4 Drawing Sheets

SUPERCONDUCTING JOINTS

BACKGROUND

It is known to produce relatively large electromagnets of superconducting wire for use, for example in magnetic resonance imaging (MRI) systems. Known magnets for MRI systems may be 2 m in diameter, 1.5 m in length and include many tens of kilometers of wire. Commonly, the magnets are composed of several relatively short coils, spaced axially along the axis of a cylindrical magnet, although several other designs are known, and the present disclosure is not limited to any particular magnet design.

Such superconducting magnets are not normally wound from a single length of superconducting wire. If several separate coils are used, they are usually produced separately and electrically joined together during assembly of the magnet. Even within a single coil, it is often necessary to join several lengths of wire together.

Joints between superconducting wires are difficult to make. Optimally, the joint itself will be superconducting—that is, having a zero resistance when the magnet is in operation. This is often compromised, and "superconducting" joints are often accepted which have a small resistance.

A common known manner of making a superconducting joint is to take the lengths of superconducting wire, and strip any outer cladding, typically copper, from the superconducting filaments from a length at or near their ends.

The superconducting filaments of the two wires may then be twisted together. The resulting twist of filaments is then coiled into a joint cup: a fairly shallow vessel, typically of copper or aluminum.

Alternatively, the filaments may be plaited, rather than twisted, before being coiled into the joint cup.

In other arrangements, the filaments of the wires are simply laid side by side, not necessarily touching one another, and placed within the joint cup. The superconducting joint is then made as described below.

The joint cup is then filled with a superconducting material, typically liquid Wood's metal, which cools and solidifies to embed the filaments in a superconductive mass. A typical joint cup may be a cylindrical vessel, closed at one end. FIG. 1 shows a conventional joint cup 10 into which wires 12 are introduced with their superconducting filaments 14 twisted together. In FIG. 1, the filaments are neither twisted nor plaited together. The joint cup is typically filled with a liquid superconducting joint material 28, such as molten Wood's metal. The superconducting joint material is then allowed, or caused, to solidify.

The present disclosure does not seek to change any of these features or method steps, but relates essentially to the joint cup itself.

Conventionally, superconducting magnets have been cooled by partial immersion in a bath of liquid cryogen, typically helium. This maintains the coils at a temperature below their superconducting transition temperature. By immersing the superconducting joints within the liquid cryogen, they can also be maintained below the superconducting transition temperature.

However, recent designs of magnets have avoided the cryogen bath, as being costly and in some circumstances wasteful of cryogen. These designs may be provided with a cooling loop or thermosiphon: a thermally conductive tube in thermal contact with the magnet which carries a circulating cryogen. The circulating cryogen is cooled and then introduced into the tube where it extracts heat from the magnet. The cryogen then expands or boils and circulates by thermal convection back to a reservoir where it is re-cooled. Circulation may be gravity induced or be assisted by any suitable means, such as a pump. A much smaller volume of cryogen is required than in an arrangement employing a cryogen bath. Cooling of the magnet coils is by conduction, through the wall of the tube, and possibly through the material of a structure supporting the magnet coils, such as a former.

In these cases, cooling of the joints is less effective than the more conventional immersion in liquid cryogen.

The present disclosure accordingly seeks improved superconducting joints and methods for cooling superconducting joints to enable the superconducting joints to be sufficiently cooled in magnets which are not cooled by immersion in a liquid cryogen.

In order to manufacture low cryogen inventory superconducting magnets—that is, those which do not rely on cooling by immersion in a bath of cryogen, but are cooled by a reduced volume of cryogen, for example in a thermosiphon or cooling loop—it is necessary to produce suitably cooled superconducting joints which do not require cooling by immersion in cryogen.

One approach to this problem may be in using flexible thermal conductors such as copper or aluminum braids or laminates thermally linking joints to a refrigerator, or by attaching superconducting joints to a cooled component using an electrically isolating adhesive layer. This latter approach is described, for example, in GB 2453734 (equivalent to US 2009/0101325 A1).

A difficulty with this latter option arises in achieving sufficient electrical isolation while maintaining adequate thermal conduction for effective cooling of superconducting joints. This generally leads to multiple interfaces between cooled component and superconducting joint, as may be seen in some of the examples described in GB 2453734.

Another approach, in which a superconductor joint is formed in thermal contact with a cooled component, but separated therefrom by an electrically isolating layer, is described in co-pending United Kingdom patent application No. GB1011475.9.

That document proposes improved superconducting joints and improved methods for forming superconducting joints in which only a single electrically isolating coating is positioned between the superconducting joint and the cooled component. The electrically isolating coating may be thinner, and is more thermally conductive, than the electrically isolating layers previously employed.

SUMMARY

It is an object to improve on these earlier structures by providing improved superconducting joints.

In a cold superconducting joint, a joint cup is provided. Lengths of superconducting filaments are placed in the joint cup. A superconducting material fills the joint cup in contact with the superconducting filaments and in thermal and mechanical contact with a pipe carrying a cryogen. The pipe extends into the joint cup and the superconducting material extends around the pipe within the joint cup.

DESCRIPTION OF THE PREFERRED EMBODIMENTS

Figure 1:
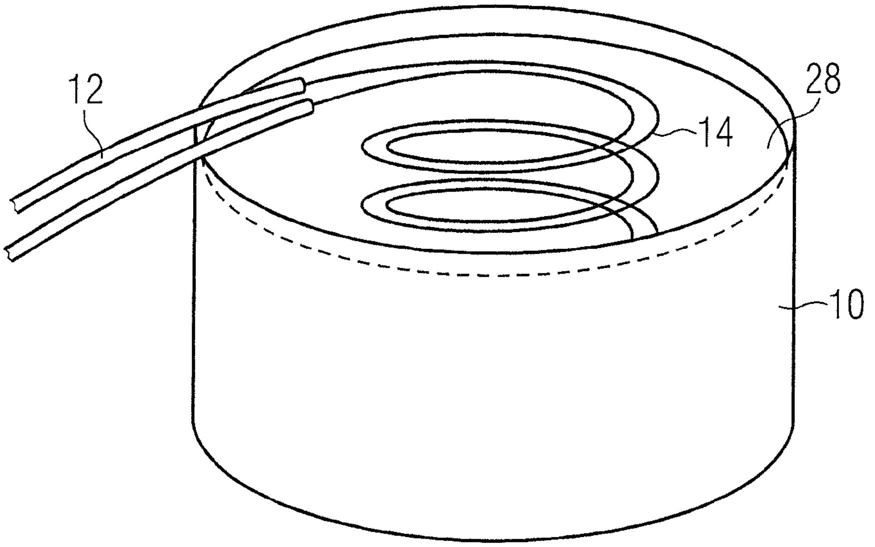
FIG. 1 shows a conventional superconducting joint using a joint cup for filling with Wood's metal.

For the purposes of promoting an understanding of the principles of the invention, reference will now be made to the preferred exemplary embodiments/best mode illustrated in the drawings and specific language will be used to describe the same. It will nevertheless be understood that no limitation of the scope of the invention is thereby intended, and such alterations and further modifications in the illustrated embodiments and such further applications of the principles of the invention as illustrated as would normally occur to one skilled in the art to which the invention relates are included.

The present exemplary embodiment provides superconducting joints which are effectively cooled and occupy less space than those of the conventional arrangements mentioned above. The present embodiment allows a large number of joints to be fitted to a low cryogen inventory superconducting magnet system, and to be effectively cooled.

As discussed above, low cryogen inventory superconducting magnets are typically cooled by a thermosiphon, being a thermally conductive pipe in thermal contact with the magnet and carrying a cryogen around a closed loop in which it is re-cooled and re-circulated.

In particular, the present embodiment provides superconducting joints which are in direct thermal contact with the conductive pipe of the thermosiphon. If the pipe is of electrically conductive material, an electrically insulating layer is applied to the appropriate surface area of the pipe before the superconducting joint is formed. In alternative exemplary embodiments, the thermosiphon pipe, or at least the appropriate portion of it, is of electrically non-conductive material, in which case the provision of an electrically insulating layer on the surface of the pipe is not necessary.

Figure 2:
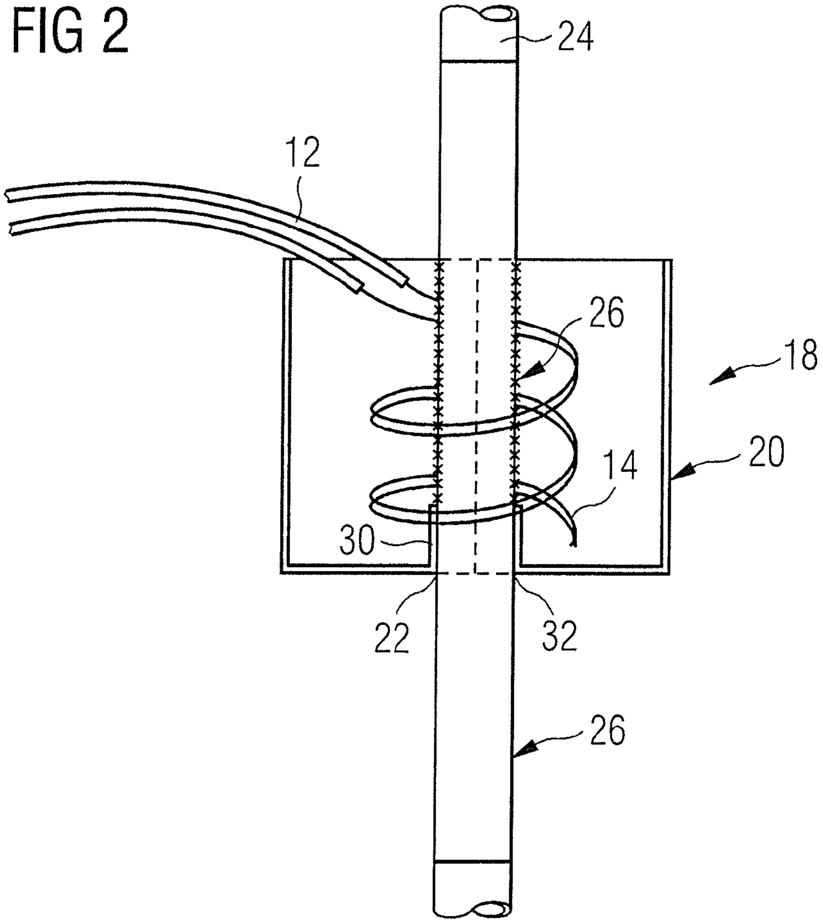
FIG. 2 shows a schematic cross-section through an exemplary embodiment of the present invention.
Figure 3:
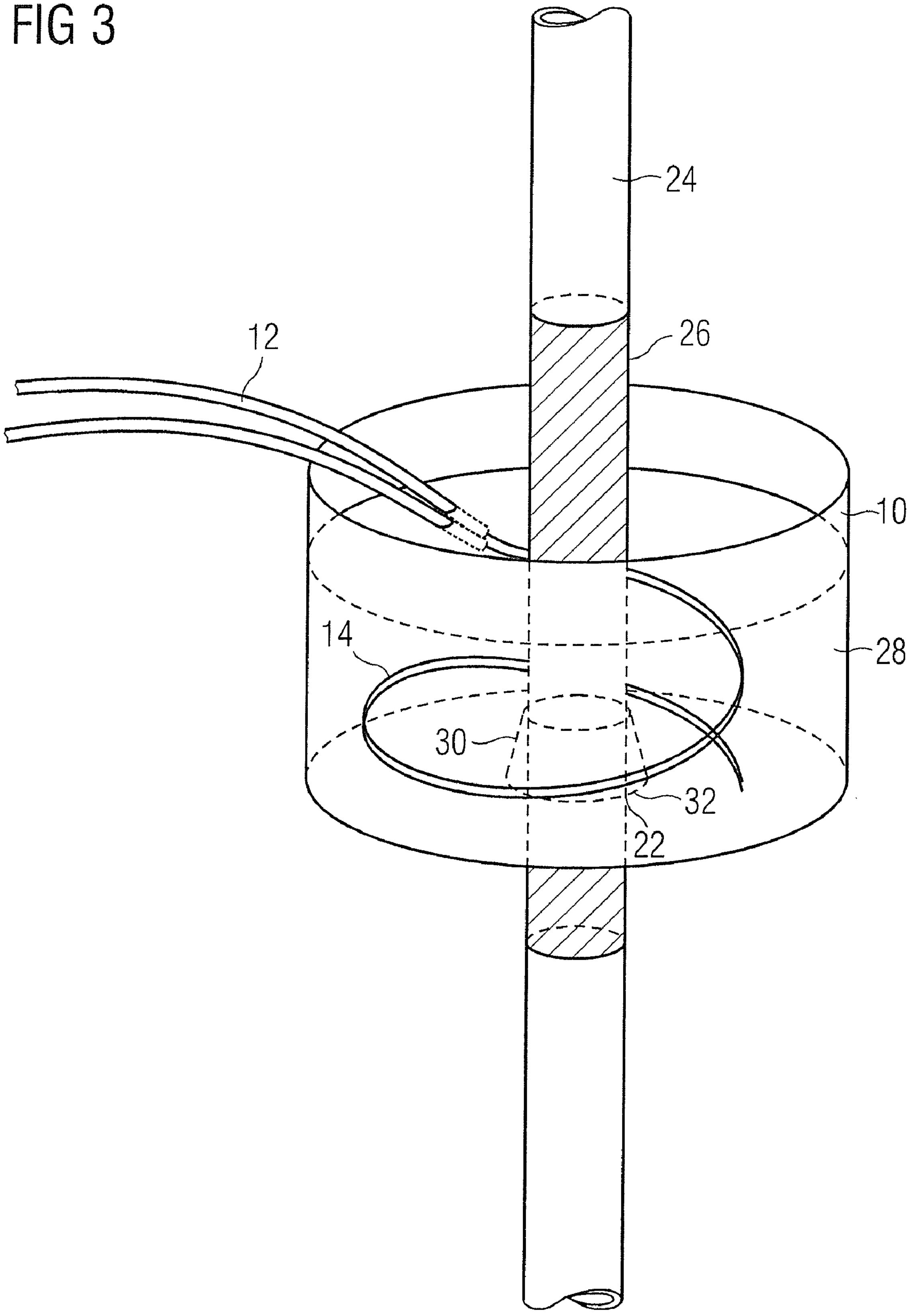
FIG. 3 shows a perspective view of the exemplary embodiment of FIG. 2.

FIG. 2 shows a schematic cross-section through an exemplary embodiment of the present invention, and FIG. 3 shows a similar perspective view.

According to this embodiment of the invention, a superconducting joint 18 comprises a joint cup 20 having a hole 22 in its base. Thermosiphon pipe 24 passes through the hole 22 in the base of the joint cup 20. This is achieved by sliding the joint cup along the pipe 24 into a desired location for the joint. Filaments 14 of superconducting wires 12 are placed in the joint cup, as described in itself with reference to the prior art and FIG. 1. The filaments may be twisted, or plaited together, or may not be. The thermosiphon pipe 24, at least in the vicinity of the joint cup 10, is provided with an electrically insulating coating layer 26. This may be a sprayed deposition of aluminum oxide or ceramic on a copper pipe, a chemically produced layer of copper oxide on a copper pipe, or a layer of aluminum oxide sprayed or formed on an aluminum pipe, for example by anodizing. Alternatively, a layer of epoxy resin or similar may be formed on the relevant surface of the pipe, for example by spraying.

The joint cup is filled with a molten superconducting material 28, such as Wood's metal, which is then allowed to cool and harden. This step is conventional in itself.

In use, the structure of FIGS. 2-3 is cooled to cryogenic temperatures by a cryogen flowing though pipe 24. In cooling, provided that materials with appropriate relative thermal expansion coefficients have been chosen, the superconducting material 28 will contract onto the pipe 24, ensuring a tight mechanical interface between the superconducting material 28 and the pipe 24, with the electrically insulating layer 26 between them.

This provides good thermal connection between the cryogen and the joint, the superconducting material 28 of the joint being separated from the cryogen only by the material of the pipe 24 and the electrically insulating layer 26.

While the electrically insulating layer 26 must be able to withstand large voltages, for example up to 5 kV which may occur during a quench, it may be relatively thin. Such ceramic or epoxy layers may be sprayed on to the pipe. Some epoxy resins, such as some of those sold under the STYCAST® brand by Emerson & Cuming, have a greater than normal thermal conductivity, and may be found useful in this application.

As illustrated in FIGS. 2 and 3, the joint cup may have a lip 30 around the periphery of the hole 22. Preferably, the lip 30 is of frusto-conical form, the narrower end of the frusto-conical form being distant from the rim 32 of hole 22. In alternative embodiments, the lip 30 may be directed into the volume of the cup, as illustrated, or may be directed in the opposite direction, away from the volume of the cup (not illustrated). Preferably, the lip is formed such that it retains the cup in position on the tube prior to formation of the superconducting joint, and prevents any molten superconducting material 28 from leaking out of the joint cup as the superconducting joint is formed. The lip should also be formed such that it does not damage the electrically insulating layer 26 when it is positioned onto the pipe.

Figure 4A:
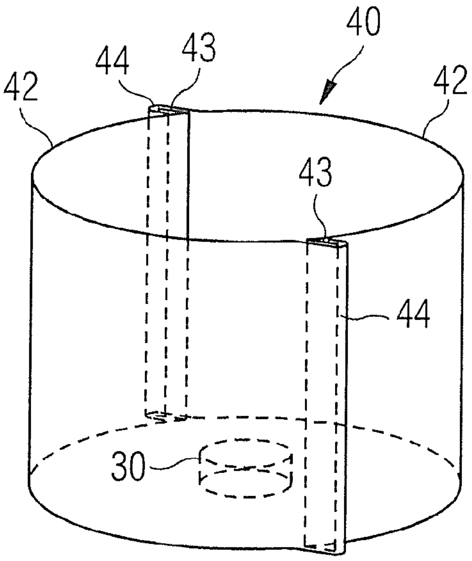
FIGS. 4A-4C illustrate an embodiment of a joint cup which is assembled from a number of identical pieces.
Figure 4B:
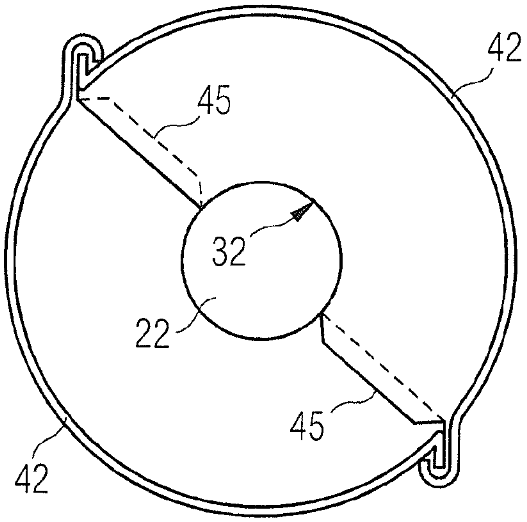
Figure 4C:
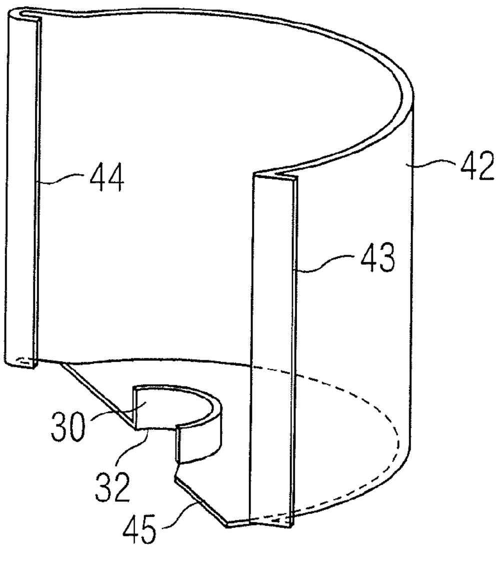

In an alternative embodiment, illustrated in FIGS. 4A-4C, a joint cup 40 is provided, which is divided into two or more pieces 42. Preferably, and as shown in FIGS. 4A-4C, a number of identical pieces are used, and are assembled together to form the joint cup 40.

In the illustrated embodiment, latching formations 43, 44 are formed at edges of each piece 42 of the joint cup 40 enabling them to be assembled together. Also preferably and as illustrated, the base of each piece 42 is provided with an overlapping protrusion 45 which helps to seal the joint between pieces 42 at the base of the joint cup to prevent leakage of molten superconducting material during formation of the superconducting joint. In addition, or alternatively, a clamp may be applied around the outer periphery of the parts of the joint cup at least until the superconducting joint is formed. In some embodiments, the latching formations 43, 44 may be crimped together to provide a more secure seal and joint between parts of the joint cup.

With such embodiments, in which the joint cup 40 is made up from a number of preferably identical parts, it is not necessary to slide the joint cup along the pipe, but rather the joint cup may be assembled from parts at the desired location. The risk of damage to the electrically insulating layer 26 is accordingly reduced.

Some superconducting materials, such as Wood's metal as commonly used, have a very high surface tension in their molten state. This helps to prevent any of the molten superconducting material from leaking from joins between parts of the joint cup, or the interface between joint cup and pipe.

Figure 5:
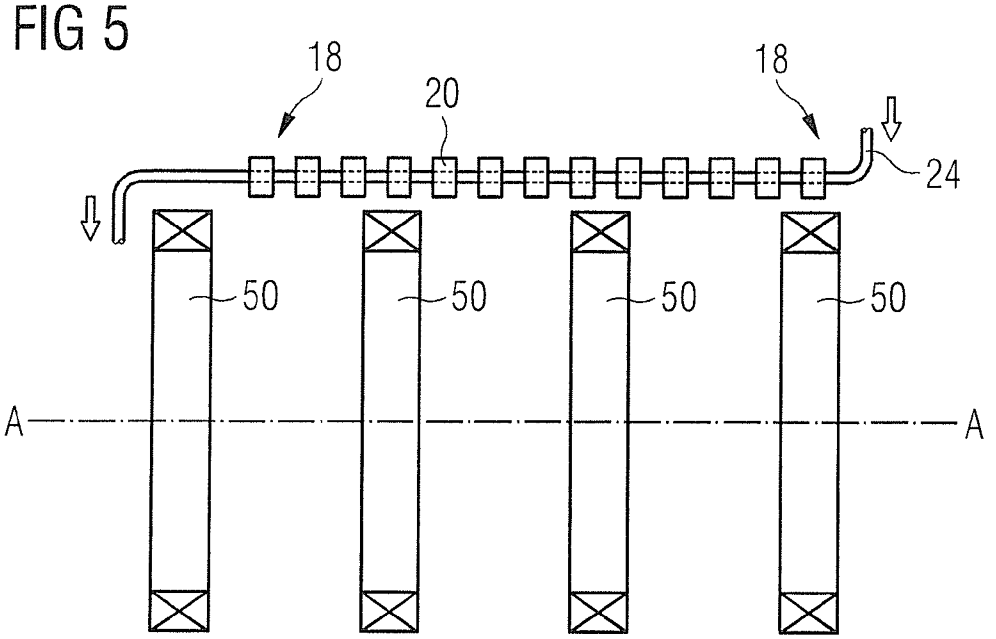
FIG. 5 schematically illustrates a partial axial cross-section example of a superconducting magnet structure cooled by a thermosiphon loop and provided with a number of superconducting joints according to an exemplary embodiment of the present invention.

FIG. 5 schematically illustrates a partial axial cross-section example of a superconducting magnet structure cooled by a thermosiphon loop and provided with a number of superconducting joints according to an exemplary embodiment of the present invention.

As shown, a number of coils 50 of superconducting wire are provided, in this case axially aligned along axis A-A. Part of a cryogen pipe 24, itself being part of a cooling loop arrangement, is shown. While the axis A-A is intended to be horizontal in this example, the pipe 24 is provided with a slight gradient to assist with gravity-fed circulation of cryogen around the cooling loop. A number of superconducting joints 18 are formed along the pipe. As discussed above, it is common to require joints between several pieces of superconducting wire making up each coil, as well as joints between the coils, so it is common for the number of superconducting joints required to significantly exceed the number of coils provided. The superconducting wires extending from the coils 50 to joints 18 are not shown in the drawings, and neither is the superconducting material 28. In an arrangement such as shown in FIG. 5, it is simpler to fill the joint cups 20 with superconducting material when the magnet is on end, with axis A-A vertical. This is a common step in the manufacturing process of such a magnet.

In use, the superconducting joints 18 will be cooled to below their superconducting transition temperature before any electric current is applied to the magnet. There should therefore be a negligible amount of power dissipated in each joint 18, meaning that the steady-state thermal load on the cooling loop from the superconducting joints should be relatively small. This situation does not apply in the case of a quench, as is well known in the art, but is not directly relevant to the present invention.

Figure 6:
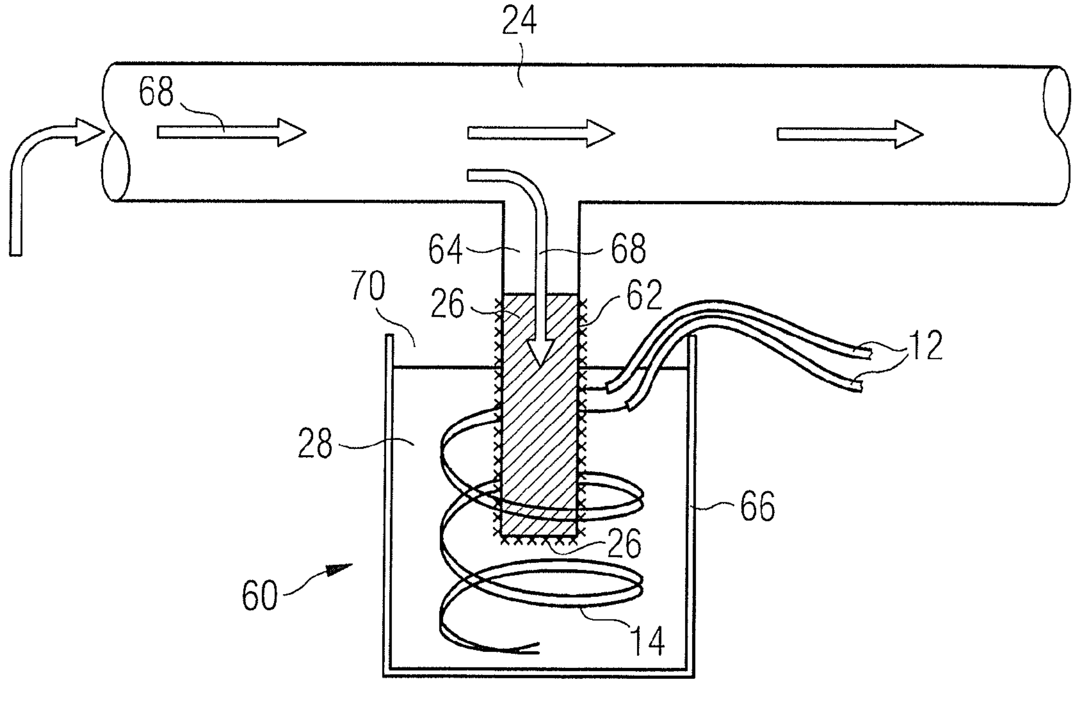
FIG. 6 shows a schematic cross-section through a superconducting joint 60 according to an alternative exemplary embodiment of the present invention.

FIG. 6 shows a schematic cross-section through a superconducting joint 60 according to an alternative exemplary embodiment of the present invention. In this embodiment, the pipe 24 carrying cryogen 68 is provided with a spur 62, extending away from the pipe, but having an interior cavity 64 open to the interior of the pipe 24, so containing cryogen 68 when the pipe contains cryogen. In this embodiment, joint cup 66 does not have a hole in its base, and the spur 62 extends into the volume of the joint cup through its open end 70. The spur 62, or at least that part of it which will be in contact with superconducting material 28, is coated with an electrically insulating layer 26. This may be formed of any of the materials and by any of the methods discussed with reference to the embodiment of FIGS. 2 and 3.

The joint 60 may be produced by the following method. As is conventional in itself, the superconducting filaments 14 to be joined are stripped of their protective outer sheaths, optionally twisted or plaited together, or not, and placed in the joint cup 66. Commonly, the filaments are coiled in order to fit into the joint cup. Preferably, this is performed in such a manner that the spur 62 extends through the center of the coil of wires. Molten superconducting material 28 is then poured into the joint cup to cover the superconducting filaments 14 and fill the joint cup to a desired depth, sufficient to contact a desired length of the spur 62. In this embodiment, it is necessary to provide a retaining arrangement (not illustrated) to hold the joint cup in place, in its desired position relative to the pipe 24, until the superconducting material 28 has solidified.

The arrangement of FIG. 6 has advantages over the arrangement of FIGS. 2 and 3 in that it does not require a hole in the base of the joint cup, eliminating the possibility of leakage from such a hole. The arrangement of FIG. 6 may be used in cases where it is preferred to construct the superconducting joint in a position where the pipe 24 runs horizontally. There is no need to slide the joint cup along the pipe, or to assemble a joint cup about the pipe. This virtually eliminates any risk of damage to the electrically isolating layer during assembly. On the other hand, the arrangement of FIG. 6 does require a spur 62 to be provided in the pipe at every location where a superconducting joint is to be provided.

In a variation of the embodiment shown in FIG. 6, the joint cup 66 may be provided with a hole in its base, and the spur 64 may extend upward through the hole into the joint cup, rather than extending down into the joint cup through its open end, as in FIG. 6.

While the above-described embodiments are all cooled by a cryogen-carrying pipe, the present exemplary embodiments extend also to similar arrangements in which the superconducting joints are cooled by conduction through a solid thermal conductor, itself cooled by a remote cooling source, such as a mechanical refrigerator or cryogen reservoir, or even a cryogen-carrying pipe which does not pass through the superconducting joint. All of the above embodiments may be adapted to such arrangements by simply replacing the cryogen-carrying pipe in each case with a solid thermal conductor. “Solid” in this context refers to the solid state of matter—not liquid or gas. A solid thermal conductor may accordingly be composed of a braid or laminate of thermally conductive material such as aluminum or copper, or a single bar of material. As with the cryogen pipe embodiments, any electrically-conducting solid thermal conductor should be coated in an electrically insulating layer in the region in which it is in contact with the superconducting joint. Coatings of aluminum oxide, ceramic or epoxy resin may be used, as discussed above with reference to the cryogen pipe embodiments. Alternatively, non-electrically conductive solid thermal conductors may be used, which would not need to be specifically coated in the region in which it is in contact with the superconducting joint. The solid thermal conductor may form part of a cooling arrangement which, in use, acts to cool the magnet to its operating temperature.

While the preferred embodiment has been described with reference to a limited number of specific examples, various modifications and variants will be apparent to those skilled in the art. For example, superconducting materials other than Wood’s metal may be used for forming the superconducting joints, and the present embodiment may be applied regardless of the cryogen used, or the application to which the joined superconducting wires are put. While the superconducting magnets described above are common applications for superconducting joints, the present embodiment may find application in ant superconducting system, such as motors, generators or energy storage systems.

The present invention has been described with reference to certain embodiments, all of which use joint cups which are circular cylindrical in shape. However, the shape of the joint cup itself is not a limitation of the invention, and the invention may be applied to joint cups which are, for example, circular, rectangular, triangular, oval and so on in cross-section. In fact, the joint cups may be of any shape, and any appropriate size, to function as a container for the superconducting joint and to hold an appropriate volume of molten superconducting material such as Wood’s metal.

As discussed above, the superconducting filaments 14 of the wires 12 may be twisted together; or may be plaited together; or may simply be placed side by side, before formation of the superconducting joint. Depending on the shape of the joint cup, the filaments may need to be coiled to allow them to be placed in the joint cup.

Although preferred exemplary embodiments are shown and described in detail in the drawings and in the preceding specification, they should be viewed as purely exemplary and not as limiting the invention. It is noted that only preferred exemplary embodiments are shown and described, and all variations and modifications that presently or in the future lie within the protective scope of the invention should be protected.

We claim as our invention:

1. A cooled superconducting joint, comprising:
a joint cup;
lengths of superconducting filaments placed in the joint cup;
a superconducting material filling the joint cup in contact with the superconducting filaments and in thermal and mechanical contact with a pipe carrying a cryogen; and
the pipe extending into the joint cup and the superconducting material extending around the pipe within the joint cup.

2. A joint according to claim 1 wherein the pipe is of an electrically conducting material, and an electrically insulating layer is provided on a surface of the pipe such that the electrically insulating layer extends between the pipe and the superconducting material, whereby the superconducting joint is electrically insulated from the pipe.

3. A joint according to claim 1 wherein the pipe is of an electrically non-conducting material.

4. A joint according to claim 1 wherein the pipe passes through the joint cup, and the superconducting material extends around the pipe within the joint cup.

5. A joint according to claim 4 wherein the joint cup is provided with a hole in its base, and the pipe extends through the hole in the base of the joint cup.

6. A joint according to claim 4 wherein the joint cup is formed in at least two pieces, and is assembled around the pipe prior to formation of the superconducting joint.

7. A joint according to claim 4 wherein the joint cup is formed as a single piece, and is placed over the pipe prior to formation of the superconducting joint.

8. A joint according to claim 4 wherein a plurality of superconducting joints are formed in a corresponding plurality of joint cups, the pipe passing through each of the joint cups.

9. A joint according to claim 1 wherein the pipe is provided with a spur, and the spur of the pipe extends into the joint cup; and the superconducting material extends around the pipe within the joint cup and the spur of the pipe is coated with an electrically insulating layer which extends between the spur of the pipe and the superconducting material.

10. A joint according to claim 2 wherein the electrically insulating layer comprises a ceramic spray coating applied to an outer surface of the pipe.

11. A cooled superconducting magnet, comprising:
a number of coils of superconducting wire joined by joints; the joints each comprising
a joint cup,
lengths of superconducting filaments placed in the joint cup,
a superconducting material filling the joint cup in contact with the superconducting filaments and in thermal and mechanical contact with a pipe carrying a cryogen, and
the pipe extending into the joint cup and the superconducting material extending around the pipe within the joint cup; and
the pipe forming part of a thermosiphon which, in use, acts to cool the magnet to its operating temperature.

12. A cooled superconducting joint, comprising:
a joint cup;
superconducting filaments placed in the joint cup;
a superconducting material filling the joint cup in contact with the superconducting filaments and in thermal and mechanical contact with a solid thermal conductor; and
the solid thermal conductor extending into the joint cup and the superconducting material extending around the solid thermal conductor within the joint cup.

13. A cooled superconducting joint according to claim 12 wherein the solid thermal conductor is one of: a braid or a laminate of thermally conductive material, or a single bar of material.

14. A joint according to claim 12 wherein the solid thermal conductor is of an electrically conducting material, and an electrically insulating layer is provided on a surface of the solid thermal conductor such that the electrically insulating layer extends between the solid thermal conductor and the superconducting material, whereby the superconducting joint is electrically insulated from the solid thermal conductor.

15. A joint according to claim 12 wherein the solid thermal conductor is of an electrically non-conducting material.

16. A joint according to claim 12 wherein the solid thermal conductor passes through the joint cup and the superconducting material extends around the solid thermal conductor within the joint cup.

17. A joint according to claim 16 wherein the joint cup is provided with a hole in its base, and the solid thermal conductor extends through the hole in the base of the joint cup.

18. A joint according to claim 16 wherein the joint cup is formed in at least two pieces, and is assembled around the solid thermal conductor prior to formation of the superconducting joint.

19. A joint according to claim 16 wherein the joint cup is formed as a single piece, and is placed over the solid thermal conductor prior to formation of the superconducting joint.

20. A joint according to claim 16 wherein a plurality of superconducting joints are formed in a corresponding plurality of joint cups, the solid thermal conductor passing through each of the joint cups.

21. A joint according to claim 12 wherein the solid thermal conductor is provided with a spur, and the spur of the solid thermal conductor extends into the joint cup; and the superconducting material extends around the solid thermal conductor within the joint cup, and the spur of the solid thermal conductor is coated with an electrically insulating layer which extends between the spur of the solid thermal conductor and the superconducting material.

22. A joint according to claim 14 wherein the electrically insulating layer comprises a ceramic spray coating applied to an outer surface of the solid thermal conductor.

23. A cooled superconducting magnet comprising:
a number of coils of superconducting wire joined by joints; the joints each comprising
a joint cup,
lengths of superconducting filaments placed in the joint cup,
a superconducting material filling the joint cup in contact with the superconducting filaments and in thermal and mechanical contact with a pipe carrying a cryogen, and
the pipe extending into the joint cup and the superconducting material extending around the pipe within the joint cup; and
the solid thermal conductor forming part of a cooling arrangement which, in use, acts to cool the magnet to its operating temperature.

* * * * *